United States Patent
Mischitz et al.

(10) Patent No.: US 10,515,910 B2
(45) Date of Patent: Dec. 24, 2019

(54) SEMICONDUCTOR DEVICE HAVING A POROUS METAL LAYER AND AN ELECTRONIC DEVICE HAVING THE SAME

(71) Applicant: INFINEON TECHNOLOGIES AG, Neubiberg (DE)

(72) Inventors: Martin Mischitz, Wernberg (AT); Kurt Matoy, Villach (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 522 days.

(21) Appl. No.: 14/535,456

(22) Filed: Nov. 7, 2014

(65) Prior Publication Data

US 2016/0133584 A1 May 12, 2016

(51) Int. Cl.
*H01L 23/482* (2006.01)
*H01L 23/00* (2006.01)

(52) U.S. Cl.
CPC .......... *H01L 24/05* (2013.01); *H01L 23/4824* (2013.01); *H01L 24/03* (2013.01); *H01L 24/36* (2013.01); *H01L 24/84* (2013.01); *H01L 24/37* (2013.01); *H01L 2224/03848* (2013.01); *H01L 2224/0501* (2013.01); *H01L 2224/05083* (2013.01); *H01L 2224/05111* (2013.01); *H01L 2224/05139* (2013.01); *H01L 2224/05144* (2013.01); *H01L 2224/05147* (2013.01); *H01L 2224/05155* (2013.01); *H01L 2224/371* (2013.01); *H01L 2224/37599* (2013.01); *H01L 2224/8485* (2013.01); *H01L 2224/84801* (2013.01); *H01L 2924/351* (2013.01)

(58) Field of Classification Search
CPC ............ H01L 24/05; H01L 24/03; H01L 2224/03848; H01L 2224/0501; H01L 2224/05083; H01L 2224/05111; H01L 2224/05139; H01L 2224/05144; H01L 2224/05147; H01L 2224/05155
See application file for complete search history.

(56) References Cited

U.S. PATENT DOCUMENTS

| | | | |
|---|---|---|---|
| 5,495,978 A * | 3/1996 | Muth | B23K 1/19 228/122.1 |
| 6,215,185 B1 * | 4/2001 | Kikuchi | H01L 23/49579 257/718 |
| 2007/0079863 A1 | 4/2007 | Stan et al. | |
| 2007/0090895 A1 | 4/2007 | Nishizawa et al. | |
| 2008/0145607 A1 * | 6/2008 | Kajiwara | H01L 21/563 428/137 |
| 2008/0277772 A1 * | 11/2008 | Groenhuis | H01L 21/6835 257/690 |

(Continued)

FOREIGN PATENT DOCUMENTS

| CN | 1949525 A | 4/2007 |
|---|---|---|
| CN | 1956325 A | 5/2007 |

(Continued)

*Primary Examiner* — Brigitte A Paterson
(74) *Attorney, Agent, or Firm* — Viering, Jentschura & Partner MBB

(57) ABSTRACT

According to various embodiments, a semiconductor device may include: a contact pad; a metal clip disposed over the contact pad; and a porous metal layer disposed between the metal clip and the contact pad, the porous metal layer connecting the metal clip and the contact pad with each other.

17 Claims, 7 Drawing Sheets

(56) References Cited

U.S. PATENT DOCUMENTS

| | | | |
|---|---|---|---|
| 2009/0189264 A1* | 7/2009 | Yato | H01L 23/49513 257/676 |
| 2010/0148316 A1* | 6/2010 | Kim | H01L 21/6835 257/621 |
| 2010/0187678 A1* | 7/2010 | Kajiwara | H01L 21/56 257/692 |
| 2011/0101416 A1* | 5/2011 | Schulze | H01L 29/0834 257/139 |
| 2011/0227207 A1* | 9/2011 | Yilmaz | H01L 23/49537 257/676 |
| 2012/0133037 A1* | 5/2012 | Cruz | H01L 23/3142 257/676 |
| 2012/0248618 A1* | 10/2012 | Akino | H01L 24/05 257/773 |
| 2013/0256894 A1* | 10/2013 | Adema | H01L 24/83 257/762 |
| 2014/0111956 A1* | 4/2014 | Taniguchi | B23K 35/02 361/771 |

FOREIGN PATENT DOCUMENTS

| | | |
|---|---|---|
| CN | 101015055 A | 8/2007 |
| CN | 101356633 A | 1/2009 |
| CN | 101499450 A | 8/2009 |
| CN | 102054859 A | 5/2011 |
| CN | 102738105 A | 10/2012 |
| WO | 2006031886 A2 | 3/2006 |

* cited by examiner

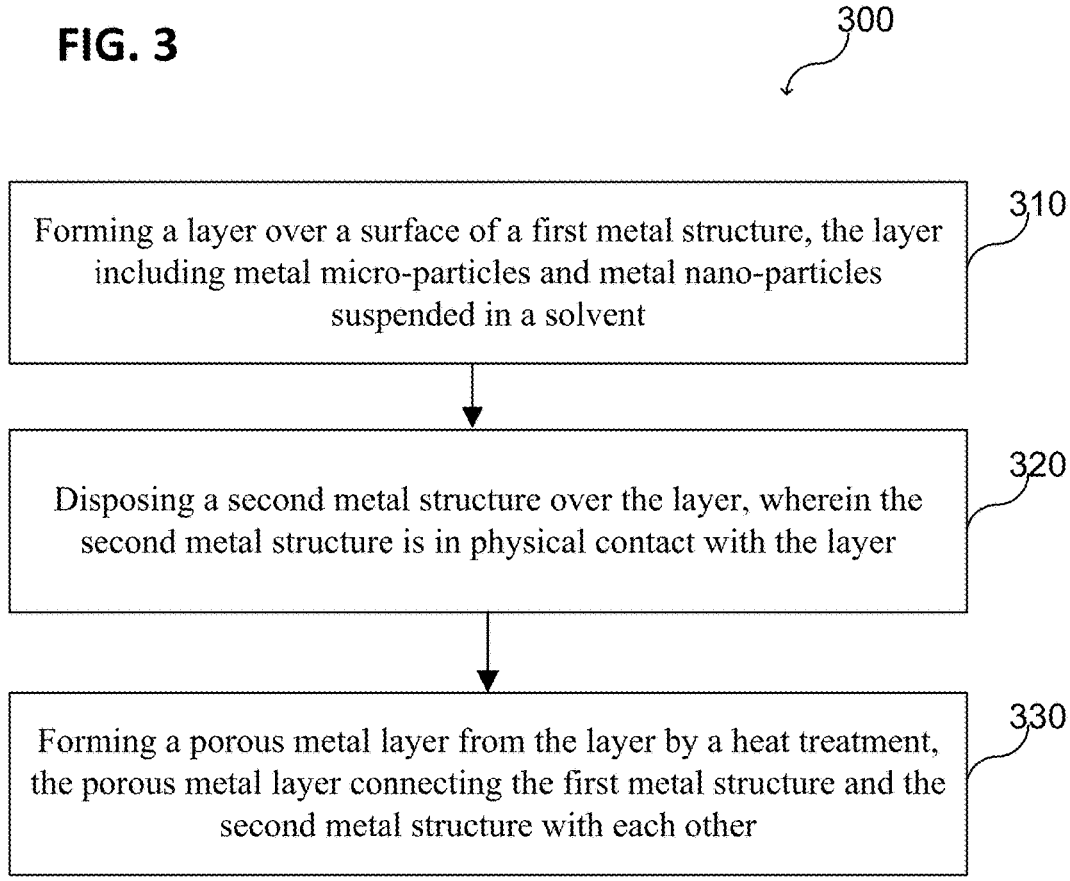

SEMICONDUCTOR DEVICE HAVING A POROUS METAL LAYER AND AN ELECTRONIC DEVICE HAVING THE SAME

TECHNICAL FIELD

Various embodiments generally relate to a semiconductor device and an electronic device and a method for electrically connecting two metal structures with each other.

BACKGROUND

In general, an electronic device may include for example one or more terminals, e.g. input terminals and/or output terminals, for operating the electronic device. The one or more terminals may be electrically connected to another device, to an electronic circuit, to a lead frame, or to a printed circuit board by using, for example, one or more bond wires or one or more metal clips. The one or more terminals may be provided, for example, as one or more contact pads or as any other suitable metal structure. Conventionally, the bond wires or metal clips may be soldered to the contact pads or may be connected to the contact pads by other suitable techniques, as for example wire bonding or by electrically conductive glue. Alternatively, metal clips may be connected to the contact pads by using a clamped connection or plug connection. An integrated circuit, also referred to as chip or die, may include one or more contact pads, e.g. as part of a metallization, wherein bond wires or metal clips may be used to electrically connect the integrated circuit to another structure, e.g. to a lead frame or to a printed circuit board. There are various techniques for packaging a chip or a die in semiconductor industry, wherein, for example, metal clips may be used to connect a power semiconductor device to a lead frame or to another wiring structure during packaging.

SUMMARY

According to various embodiments, a semiconductor device may include: a contact pad; a metal clip disposed over the contact pad; and a porous metal layer disposed between the metal clip and the contact pad, the porous metal layer connecting the metal clip and the contact pad with each other.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 shows a schematic flow diagram of a method for connecting a first metal structure and a second metal structure to each other according to various embodiments;

DESCRIPTION

Figure 1:
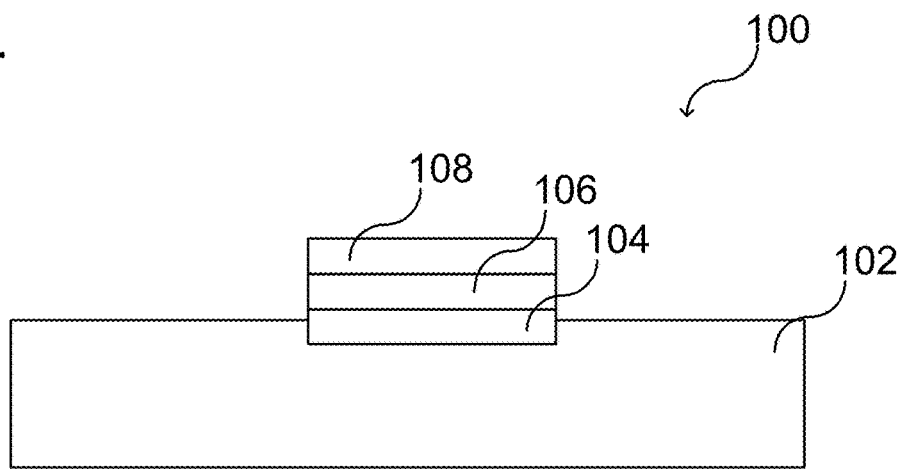
FIG. 1 shows a semiconductor device in a schematic cross sectional view or side view according to various embodiments.

The following detailed description refers to the accompanying drawings that show, by way of illustration, specific details and embodiments in which the invention may be practiced.

Any embodiment or design described herein as exemplary is not necessarily to be construed as preferred or advantageous over other embodiments or designs. The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a structure element) provided at least one of on or in a carrier (e.g. a substrate, a wafer, a chip, a die, or a semiconductor work piece) or "laterally" next to, may be used herein to mean an extension or a positional relationship along a surface of the carrier. That means that a surface of a carrier (e.g. a surface of a substrate, a surface of a wafer, a surface of a chip, a surface of a die, or a surface of a work piece) may serve as reference, commonly referred to as the main processing surface (e.g. the front side of a chip or a die). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier). The term "thickness" used with regards to a "thickness" of a layer may be used herein to mean the spatial extension of the layer perpendicular to the surface of the support (the material or material structure) on which the layer is deposited. If a surface of the support is parallel to the surface of the carrier (e.g. parallel to the main processing surface) the "thickness" of the layer deposited on the surface of the support may be the same as the height of the layer. Further, a "vertical" structure may refer to a structure extending in a direction perpendicular to the lateral direction (e.g. perpendicular to the main processing surface of a carrier) and a "vertical" extension may refer to an extension along a direction perpendicular to the lateral direction (e.g. an extension perpendicular to the main processing surface of a carrier).

The term "power" used with regards to a "power" device, "power" integrated circuit structure, or "power" metallization, as well as "power" integrated circuit, "power" transistor, "power" diode, and the like, may be used herein to mean that the device, the circuit structure, or the metallization may be configured to handle high electrical currents, e.g. electrical currents greater than about 10 A or electrical currents in the range from about 10 A to about 1000 A, or electrical currents even greater than about 1000 A, and to handle high electrical voltages, e.g. electrical voltages greater than 100 V or electrical voltages in the range from about 100 V to about 10 kV, or electrical voltages even greater than about 10 kV. According to various embodiments, a power device may be operated as switch or as rectifier. Further, a power device may be capable of carrying high current and may have a high reverse blocking voltage (e.g. the reverse blocking voltage may be greater than about 100 V or even greater than about 1000 V).

The term "porous" or "porosity" used with regards to a porous material, a porous layer, or porous metal layer may be used herein to mean a measure of the voids (also called void spaces, empty spaces, or pores) in a material between 0 and 1 (which may be also expressed as a percentage between 0 and 100%), wherein the porosity is a fraction of the volume of voids over the total volume. A material with a porosity of 0 may have the greatest material specific density. The pore structure in a material or in a layer may be open-pored or closed pored, wherein open pores may be referred to as effective pores and closed pores may be referred to as ineffective pores.

Accordingly, a material or a layer may have a gross density (also referred to as bulk density), $\rho$, less than the theoretical density (also referred to as true density), $\rho_0$, due to voids in the material or in the layer, wherein the porosity may be determined by measuring the gross density and calculating the porosity, $\Phi$, as $1-\rho/\rho_0$. There, pores (voids or empty spaces) provided by a host material and/or pores being at least partially filled with a material different from the host material may be considered by the gross density, while only the host material which forms the pores may be considered by the theoretical density. According to various embodiments, the pores may be filled or partially filled with a fluid, e.g. a gas, or in other words, the pores may be at least partially free of, e.g. completely free of, solid material.

According to various embodiments, the term "metal" used with regards to a metal layer, a metal particle, a metal nano-particle, a metal micro-particle, may be used herein to mean a metal, e.g. copper, silver, nickel, aluminum, gold, and the like, as well as a metal alloy, e.g. an alloy of two or more than two metals, e.g. a copper/aluminum alloy, as well as an alloy of at least one metal and a metalloid, e.g. a copper/silicon alloy, an aluminum/silicon alloy, or an copper/aluminum/silicon alloy. Illustratively, a metal may include any material having the typical properties of metals, e.g. metals may be opaque, shiny, and have a high electrical and thermal conductivity. Further, metals may be malleable and ductile.

According to various embodiments, a porous metal layer may include a cellular metal and/or a metallic foam; or in other words, the layer may include a metal with pores deliberately integrated in its structure. The porous metal layer may have a volume of pores or (in other words a porosity) greater than about 20%, e.g. greater than about 30%, e.g. greater than about 40%, e.g. greater than about 50%, e.g. greater than about 60%, e.g. greater than about 70%, e.g. greater than about 80%, e.g. in the range from about 20% to about 95%, e.g. in the range from about 30% to about 90%, e.g. in the range from about 40% to about 80%. According to various embodiments, a porous metal layer may also include a metal sponge or a porous metal layer may include metal fibers.

According to various embodiments, a porous metal layer may include at least one metal, e.g. copper, as well as a large volume fraction of gas-filled pores in the at least one metal. The pores may be sealed (also referred to as closed-cell foam) or the pores may form an interconnected network (also referred to as open-cell foam). According to various embodiments, a layer may include a metal foam with a porosity in the range from about 60% to about 95%.

Various embodiments may base on the knowledge, that the strength of a foamed metal (or in other words the strength of a porous metal of a porous metal layer) may be related to its density; e.g. the strength of a material may decrease as the porosity increases. According to various embodiments, the elasticity and/or the shear modulus of a metal layer may be reduced by introducing pores into the metal layer; or in other words, a porous metal layer may have a smaller elasticity and/or a smaller shear modulus than the metal layer without pores.

According to various embodiments, particles, e.g. metal particles, can be classified according to their diameter, wherein for example a suspension including a plurality of particles (e.g. a particle distribution) with various diameters may be characterized by the mean diameter of the particles. A nano-particle suspension may include for example particles, wherein the mean diameter of the particles may be in the nanometer range, e.g. below 1 µm or in the range from about 1 nm to about 1000 nm. A micro-particle suspension may include for example particles, wherein the mean diameter of the particles may be in the micrometer range, e.g. below 1 mm or in the range from about 1 µm to about 1000 µm, e.g. in the range from about 1 µm to about 100 µm. According to various embodiments, a nano-particle suspension may be formed by introducing a metal powder including metal nano-particles into a liquid solvent or viscous solvent. According to various embodiments, a micro-particle suspension may be formed by introducing a metal powder including metal micro-particles into a liquid solvent or viscous solvent. According to various embodiments, a liquid solvent or a viscous solvent may include an ink or a paste. According to various embodiments, metal micro-particles and metal nano-particles suspended in a solvent may be also referred to as ink or paste.

According to various embodiments, a particle (e.g. a metal particle) may have any shape, wherein the diameter of the particle may be regarded as the maximal spatial extension of the particle. Nanoparticles with a size (e.g. with a diameter or with a maximal spatial extension) in the range from about 1 nm to about 100 nm may be referred to as ultrafine particles. Particles with a size (e.g. with a diameter or with a maximal spatial extension) in the range from about 100 nm to about 2.5 µm may be referred to as fine particles. Particles with a size (e.g. with a diameter or with a maximal spatial extension) in the range from about 2.5 µm to about 10 µm may be referred to as coarse particles. According to various embodiments, for forming a porous metal layer ultrafine particles and fine particles may be used. According to various embodiments, for forming a porous metal layer ultrafine particles and coarse particles may be used. According to various embodiments, ultrafine particles, fine particles, and coarse particles suspended in the same solvent may be used for forming a porous metal layer.

FIG. 1 illustrates a semiconductor device 100 in a schematic cross sectional view or side view according to various embodiments. The semiconductor device 100 may include at least one integrated circuit structure 102 or a semiconductor carrier 102 including at least one integrated circuit structure, wherein the at least one integrated circuit structure may include at least one of the following: an integrated transistor, an integrated capacitor, an integrated coil, an integrated resistor or any other integrated circuit structure used in semiconductor technology, an integrated battery. According to various embodiments, the integrated circuit structure 102 may be formed at least one of over and in a semiconductor body. According to various embodiments, the semiconductor device 100 (or in other words the integrated circuit structure 102 or semiconductor carrier 102) may include a chip 102 or a die 102, wherein the chip 102 or the die 102 may be readily processed in any semiconductor technology. According to various embodiments, the semiconductor device 100 may include at least one of the following semiconductor devices or may be configured as one of the following semiconductor devices: a two terminal device, e.g. a diode (e.g. a PIN diode or a Schottky diode, e.g. a SiC Schottky diode), and/or a three terminal device, e.g. a MOSFET (metal oxide semiconductor field-effect transistor), a JFET (junction gate field-effect transistor), e.g. a SiC JFET, a thyristor (e.g. in metal oxide semiconductor (MOS) technology), an IGBT (insulated-gate bipolar transistor), and the like. Further, the semiconductor device 100 may include more than three terminals. According to various embodiments, the semiconductor device 100 may be or may include a readily processed integrated circuit or integrated circuit structure in any technology, e.g. in MOS technology or in CMOS (complementary metal oxide semiconductor) technology.

According to various embodiments, the semiconductor carrier 102 and/or the integrated circuit structure 102 may include or may be configured to provide at least one of the following: a readily processed integrated circuit, a CMOS (complementary metal oxide semiconductor) integrated circuit, a bipolar transistor, an IGBT, and/or a micro-electromechanical system (MEMS), or another component or another structure, as for example, a chip, a memory chip, a die, a microprocessor, a microcontroller, a memory structure, a charge storage memory, a random access memory, a dynamic random access memory, a logic circuit, a sensor, a nano-sensor, an integrated transceiver, a micro-mechanical device, a micro-electronic device, nano-electronic device, an electrical circuit, a digital circuit, an analog circuit, and any other electronic device based on semiconductor technology.

Further, the semiconductor device 100 may be a power semiconductor device 100, e.g. including a power integrated circuit (e.g. a power transistor, a power switch, a power diode, a power transceiver, a power amplifier, and the like). According to various embodiments, a power semiconductor device 100 may be configured to be operated at high electrical voltages and high electrical currents, e.g. at a voltage greater than 100 V with a current greater than 10 A. According to various embodiments, a power semiconductor device, such as a power diode, a power bipolar junction transistor, a power insulated gate bipolar transistor, or a power metal oxide semiconductor field-effect transistor (power MOSFET), may be operated at a voltage of up to 1000 V or up to 5000 V, and at a high current of up to 100 A or up to 5000 A. A power semiconductor device, or a power integrated circuit structure, as referred to herein, may be or may include at least one of the following: a two terminal power device, e.g. a power diode, and/or a three terminal device, e.g. a power MOSFET, a power JFET, a power thyristor, a power IGBT, and the like. Further, the semiconductor device, the semiconductor power device, or the power integrated circuit structure as referred to herein may be or may include any other suitable multi terminal device, e.g. with four or more than four terminals, e.g. a power transmitter device, a power receiver device, a power transceiver device, a power RF-(radio frequency)-switch, and the like.

According to various embodiments, the semiconductor device 100 may include at least one contact pad 104 (e.g. one or more contact pads 104) or a contact pad structure 104. The at least one contact pad 104 may be disposed over the at least one integrated circuit structure 102 or over the semiconductor carrier 102 including the at least one integrated circuit structure. The at least one contact pad 104 may electrically contact the at least one integrated circuit structure 102. Illustratively, the at least one contact pad 104 may be provided to allow operating the at least one integrated circuit structure 102. According to various embodiments, the at least one contact pad 104 may be a terminal of the semiconductor device 100, a terminal of the integrated circuit structure 102, a terminal of the chip 102, or a terminal of the die 102.

According to various embodiments, the at least one contact pad 104 may be part of a metallization (e.g. of a front side metallization or of a back side metallization) provided at a first side of the chip 102 or die 102, wherein the metallization may be electrically connected to the at least one integrated circuit structure 102. The at least one contact pad 104 may include a single layer of a layer stack including a plurality of sublayers.

Further, the semiconductor device 100 may include a porous metal layer 106 disposed over (e.g. directly on) the at least one contact pad 104. According to various embodiments, the porous metal layer 106 may include at least one of the following: a microporous metal having for example pores with sizes less than about 2 nm, a mesoporous metal having for example pores with sizes in the range from about 2 nm to about 50 nm, a macroporous metal having for example pores with sizes greater than about 50 nm.

According to various embodiments, the porous metal layer 106 may include pores having for example sizes (e.g. diameters) greater than about 100 nm, e.g. greater than about 200 nm, e.g. greater than about 300 nm, e.g. greater than about 400 nm, e.g. greater than about 500 nm, e.g. greater than about 600 nm, e.g. greater than about 700 nm, e.g. greater than about 800 nm, e.g. greater than about 900 nm, e.g. greater than about 1 µm, e.g. greater than about 2 µm, e.g. greater than about 5 µm, e.g. greater than about 10 µm, e.g. greater than about 15 µm. Further, the porous metal layer 106 may include open pores and/or closed pores.

Further, the semiconductor device 100 may include at least one metal clip 108 disposed over (e.g. directly on) the porous metal layer 106. According to various embodiments, the porous metal layer 106 may connect the metal clip 108 and the contact pad 104 with each other, e.g. mechanically and/or electrically.

According to various embodiments, the porous metal layer 106 may be formed, for example, by printing a suspension over the contact pad 104 (e.g. introducing the suspension into a gap provided between the contact pad 104 and the metal clip 108), the suspension including metal micro-particles and metal nano-particles suspended in an organic solvent, and by annealing (also referred to as heat treatment) the suspension being printed over contact pad 104 (or being provided between the contact pad 104 and the metal clip 108). During the annealing, the organic solvent may be at least partially expelled and the metal microparticles and the metal nano-particles may agglomerate; thereby the metal micro-particles and the metal nano-particles forming the porous metal layer 106. The annealing may be performed in a pre-defined gas environment.

In one or more embodiments, the porous metal layer 106 may include porous copper. Therefore, the porous metal layer 106 may have a high thermal and electrical conductivity, wherein, at the same time, the porous metal layer 106 may have a reduced shear modulus compared to a copper layer without pores. Conventionally, a metal layer (e.g. a copper layer) may be deposited over a contact pad by physical vapor deposition or chemical vapor deposition, wherein the metal layer may be substantially free of pores.

According to various embodiments, the metal clip 108 may include the same metal as the porous metal layer 106, e.g. copper. Therefore, the metal clip 108 may adhere to the porous metal layer 106 during the annealing. Further, the contact pad 104 (or a topmost layer of the contact pad 104) may include the same metal as the porous metal layer 106, e.g. copper. Therefore, the contact pad 104 may adhere to the porous metal layer 106 during the annealing. In one or more embodiments, the porous metal layer 106, the contact pad 104 and the metal clip 108 may include one or more metals being selected to form an alloy during the annealing.

According to various embodiments, the porous metal layer 106 may have a thickness greater than about 5 μm, e.g. in the range from about 5 μm to about 100 μm, e.g. in the range from about 20 μm to about 60 μm. Further, the metal clip 108 may have a thickness greater than about 5 μm, e.g. greater than about 50 μm, e.g. greater than about 100 μm, or e.g. a thickness in the range from about 5 μm to about 1 mm. The metal clip 108 may be a massive metal part compared to the layers typically used in semiconductor processing. According to various embodiments, the at least one contact pad 104 may have a quadratic or rectangular surface 104s, e.g. seen from the top (cf. for example FIG. 5A). However, a non-quadratic or non-rectangular surface may be provided as well in accordance with further embodiments. The surface area of the at least one contact pad 104 may be greater than about 25 μm², e.g. greater than about 100 μm², e.g. greater than about 1000 μm², e.g. greater than about 1 mm². Further, the metal clip 108 may at least partially cover the contact pad 104, and, accordingly, the porous metal layer 106 may at least partially cover the contact pad 104.

According to various embodiments, the semiconductor device 100 may include a plurality of contact pads 104, wherein each contact pad 104 of the plurality of contact pads 104 may be electrically contacted by a respective metal clip 108. According to various embodiments, the semiconductor device 100 may include a housing or a so called package, wherein the metal clip 108 may electrically connect the integrated circuit structure 102 (or the chip 102 or the die 102) to the package. The package may include for example a lead frame and the metal clip 108 may electrically connect the integrated circuit structure 102 to the lead frame. Alternatively, the package may include for example any other contact structure (e.g. pins or balls) and the metal clip 108 may electrically connect the integrated circuit structure 102 to the contact structure of the package. According to various embodiments, in case the semiconductor device 100 is a power semiconductor device, the package may be a power semiconductor package, as used in semiconductor industry.

According to various embodiments, the metal clip 108 may be perforated (cf. for example FIG. 2 or FIGS. 6A to 7E). According to various embodiments, the semiconductor device 100 may include silicon or may be provided in a work piece including or consisting of silicon. According to various embodiments, the semiconductor device 100 may include silicon carbide or may be provided in a work piece including or consisting of silicon carbide. According to various embodiments, the semiconductor device 100 may include gallium nitride or may be provided in a work piece including or consisting of gallium nitride. However, semiconductor device 100 may include or may be made from other semiconductor materials than silicon.

According to various embodiments, a porous copper layer may be used to electrically contact any electronic circuit or electronic device. Using the porous copper layer may allow to adhere a metal clip and/or a bond wire (or any other type of metal structures) to a contact pad, thereby also providing an electrically conductive connection. In other words, FIG. 1 may show an electronic device 100 that may include: a contact pad 104; a metal structure 108 (e.g. a metal clip, a bond wire, or any other type of metal structure) disposed over the contact pad 104; and a porous copper layer 106 disposed between the contact pad 104 and the metal structure 108, the porous copper layer 106 connecting the contact pad 104 and the metal structure 108 with each other, e.g. mechanically and electrically. According to various embodiments, an electronic device 100 may include: a first metal structure 104 (e.g. a contact pad, at least part of a metallization, or any other type of metal structure); a second metal structure 108 (e.g. a metal clip, a bond wire, or any other type of metal structure) disposed over the first metal structure 104; and a porous copper layer 106 disposed between the first metal structure 104 and the second metal structure 108, the porous copper layer 106 connecting the first metal structure 104 and the second metal structure 108 with each other, e.g. mechanically and electrically.

Various modifications and/or configurations of the semiconductor device 100 or the electronic device 100 and details referring to the porous metal layer 106 (e.g. porous copper layer 106) and the metal structures, e.g. configures as a metal clip 108, are described in the following, wherein the features and/or functionalities described with reference to FIG. 1 may be included analogously. Further, the features and/or functionalities described in the following may be included in the semiconductor device 100 or electronic device 100 or may be combined with the semiconductor device 100 or the electronic device 100, as described before with reference to FIG. 1.

Figure 2:
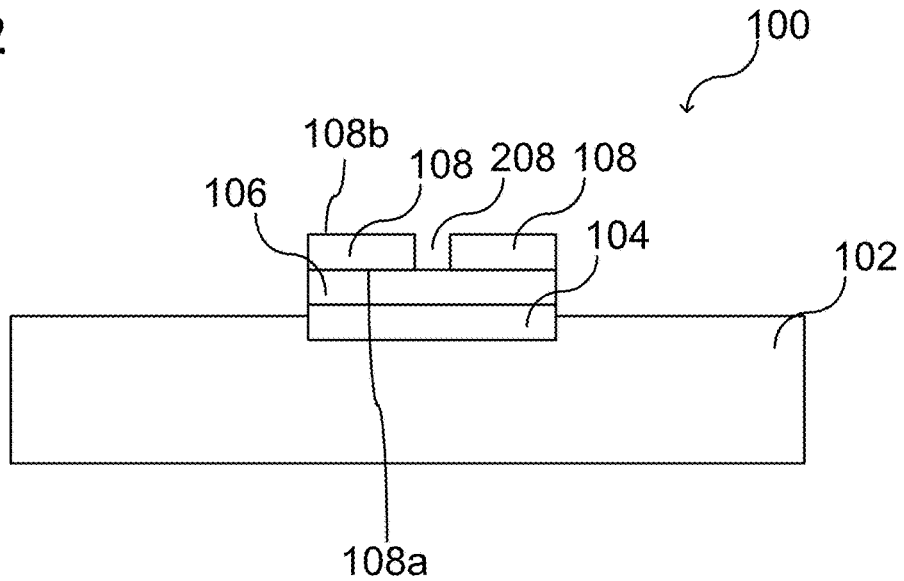
FIG. 2 shows a semiconductor device in a schematic cross sectional view or side view according to various embodiments.

FIG. 2 illustrates a semiconductor device 100 (or an electronic device 100) in a schematic cross sectional view or side view according to various embodiments, wherein the metal clip 108 (or the metal structure 108) may include a recess structure 208 extending from a first side 108a of the metal clip 108 facing the porous metal layer 106 to a second side 108b of the metal clip 108 opposite to the first side 108a. Illustratively, the metal clip 108 (or the metal structure 108) may have one or more recesses exposing the porous metal layer 106 at least partially. The recess structure 208 may be configured so that the metal clip 108 has a meander structure or a comb structure. The recess structure 208 may be formed in the metal clip 108 as a meander structure or as a comb structure. The recess structure 208 may be formed in the metal clip 108 as hole structure.

FIG. 3 illustrates a method 300 in a schematic flow diagram according to various embodiments, e.g. a method 300 for connecting (mechanically and/or electrically) a first metal structure (e.g. 104 in FIG. 1 or 2) and a second metal structure (e.g. 108 in FIG. 1 or 2) with each other. According to various embodiments, the method 300 may include: in 310, forming a layer (e.g. a suspension layer) over a surface of a first metal structure, the layer including metal micro-particles and metal nano-particles suspended in a solvent (e.g. in an organic solvent); in 320, disposing a second metal structure over the layer, wherein the second metal structure may be in physical contact with the layer; and, in 330, (e.g. subsequently) forming a porous metal layer (e.g. 106 in FIG. 1 or 2) from the layer by a heat treatment, the porous metal layer connecting the first metal structure and the second metal structure with each other.

Further, forming the suspension layer (also referred as the layer) may include a printing process, wherein the suspension of the metal micro-particles and the metal nano-particles in the solvent may be at least partially liquid, e.g. liquid or viscous. The organic solvent may include for example one or more organic polymers or one or more organic oligomers, wherein the heat treatment may be carried out in the presence of formic acid.

The solvent (e.g. the organic solvent) may be at least partially expelled from the suspension layer by the heat treatment and at least one of the metal micro-particles and the metal nano-particles agglomerate during the heat treatment. Illustratively, the metal nano-particles may provide the glue between the metal micro-particles forming a porous metal layer with a high porosity, e.g. greater than about 30%. Using only metal micro-particles may cause a poor connection between the metal micro-particles after the heat treatment and using only metal nano-particles may result rather in a dense metal layer than in a metal layer with such a high porosity.

According to various embodiments, the metal micro-particles may include copper micro-particles, e.g. having a size in the micrometer range, as already described. According to various embodiments, the metal nano-particles may include copper nano-particles, e.g. having a size in the nanometer range, as already described. Further, the heat treatment may be performed at a temperature less than the bulk melting temperature of the metal, e.g. for copper nano-particles and copper micro-particles the heat treatment may be performed at a temperature in the range from about 200° C. to about 400° C., e.g. at a temperature of about 300° C., wherein the bulk melting temperature of copper is for example about 1085° C. Further, the heat treatment may be performed in an inert gas atmosphere, including for example argon, nitrogen, or helium. Further, as already described, a reducing agent may be provided during the heat treatment (e.g. in form of a reducing gas), e.g. formic acid, to expel the organic solvent and/or to prevent oxidation of the metal micro-particles and the metal nano-particles during the heat treatment.

According to various embodiments, the porous metal layer (e.g. a porous metallic foam) may be used as connection layer between a chip metallization (e.g. 104 in FIG. 1 or 2) and a metal clip (e.g. 108 in FIG. 1 or 2), as described herein. The porous metal layer may have a reduced shear modulus and therefore more convenient mechanical properties compared to solid interconnection layers as conventionally used. For example, less forces may be transferred from a metal clip (e.g. 108 in FIG. 1 or 2) to the silicon chip or silicon die (e.g. 102 in FIG. 1 or 2) (or to a contact pad, e.g. 106 in FIG. 1 or 2) due to the reduced shear modulus of the porous metal layer, as for example illustrated in FIGS. 4A and 4B.

Figure 4A:
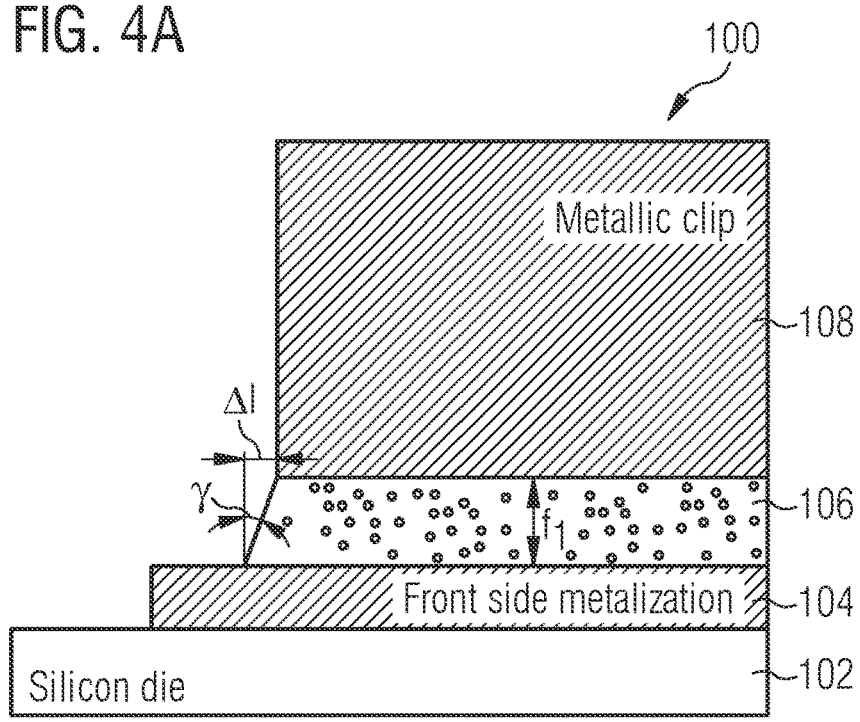
FIGS. 4A and 4B show a semiconductor device respectively in a schematic cross sectional view or side view according to various embodiments.
Figure 4B:
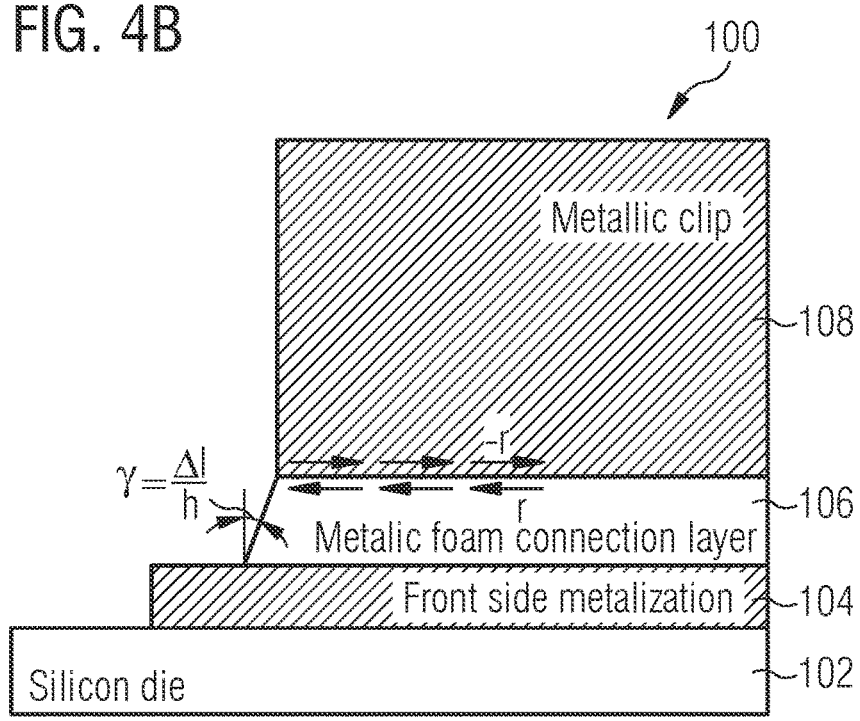

According to various embodiments, FIG. 4A and FIG. 4B respectively illustrate a semiconductor device 100 in a schematic cross sectional view or side view according to various embodiments. In general, a chip (or a die) with a large surface area, e.g. in a power package with clip interconnect, may be subjected to mechanical stress or strain during operating the chip or due to changes in temperature, wherein the mechanical stress or strain exerted onto the chip may cause a chip brakeage (or die breakage, e.g. cracks in the chip or the die) in the package. The mechanical stress or strain may be caused for example by the different coefficients of thermal expansion (CTEs) of the silicon of the chip (or of the die) and of the metal of the metallic clip or by the different coefficients of thermal expansion (CTEs) of the silicon and the lead frame.

Shear stresses, τ or −τ, at the interfaces between the chip and the interconnection layer (conventionally provided by solder or adhesive) may cause the entry of stress into the chip. However, the amount of transferred stress may be defined by the shear modulus (material constant), G, of the interconnection layer. Therefore, conventionally used solid interconnection layers may require an adaptation of the thickness of the silicon, of the thickness of the lead frame, of the thickness of the solder layer, or may limit the size of the chips, or may result in large-scale voids.

According to various embodiments, the shear stresses at the interfaces between the chip 102 and the metal clip 108 or between the chip 102 and a lead frame (e.g. at the interface between the porous metal layer 106 and the contact pad 104 and/or at the interface between the porous metal layer 106 and metal clip 108) may be reduced by the porous metal layer (e.g. by a metallic foam with macro porosity). According to various embodiments, due to the macro porosity the shear modulus, G, may be reduced. The shear stress, τ, may be directly proportional to the shear modulus.

According to various embodiments, as illustrated in FIGS. 4A and 4B, strain, $\varepsilon_{silicon}$, introduced into the silicon die 102 may be defined by the coefficient of thermal expansion of the silicon 102, $CTE_{silicon}$, and the coefficient of thermal expansion of the metal clip 108, $CTE_{clip}$, as follows:

$$\varepsilon_{silicon} = \frac{\Delta l}{l} = [CTE_{clip} - CTE_{silicon}] * \Delta T,$$

wherein ΔT is the temperature change causing the thermal expansion with a relative change in length Δl/l. Further, the shear stress, τ, is related to the shear strain, γ, with $$\tau = G * \tan\gamma$$

and $$\tan\gamma \approx \gamma = \frac{\Delta l}{h}$$

as follows:

$$\tau = G * \frac{\Delta l}{h},$$

wherein G is the shear modulus of the material, given by:

$$G = \frac{E}{2(1+v)},$$

wherein E is the Young's modulus and v is Poisson's ratio.

As a result, the shear stress, τ, transferred to the silicon die 102 (as for example illustrated in FIG. 4B) through the porous metal layer 106 may be proportional to the Young's modulus, E, of the material of the porous metal layer 106, in other words proportional to the Young's modulus, E, of the porous metal 106. The Young's modulus, E, of the porous metal layer 106 is given by the Young's modulus, $E_0$, of the metal (e.g. copper) of the porous metal layer 106 and the porosity, P, as follows:

$$E_{connection\ layer} = E_0(1-P)$$

Therefore, according to various embodiments, the porous metal layer 106, e.g. a metallic foam 106 with macro porosity (also referred to as macroporous metallic foam 106), used as interconnection layer between a chip 102 and a clip 108 may cause a reduction of the shear stress at the interfaces, since the shear modulus, G, of the interconnection layer is reduced due to the porosity. Illustratively, the porous metal layer 106 may be a buffer layer that compensates mechanical stress caused by the different CTEs of the metal clip 108 and the silicon die 102 (or the chip 102 or the metal contact pad 104).

As an example, a macro porosity of about 10%, e.g. about 10% volume fraction of macro porosity (e.g. voids with a size of about 1 μm) may result in a reduction of the maximal stress in the die 102 of about 10%. This behavior may be substantially linear, as described above. According to various embodiments, the porous metal layer 106 may include at least one of the following materials: macroporous copper, macroporous aluminum, macroporous silver, macroporous nickel, e.g. with a pore size greater than about 1 μm.

As illustrated in FIG. 4A, the contact pad 104 may be a front side metallization or may be part of a front side metallization of the silicon die 102 or of the silicon chip 102. The porous metal layer 106 may have a thickness, h, and is (e.g. laterally) deformed by a deformation, Δ1.

Figure 5A:
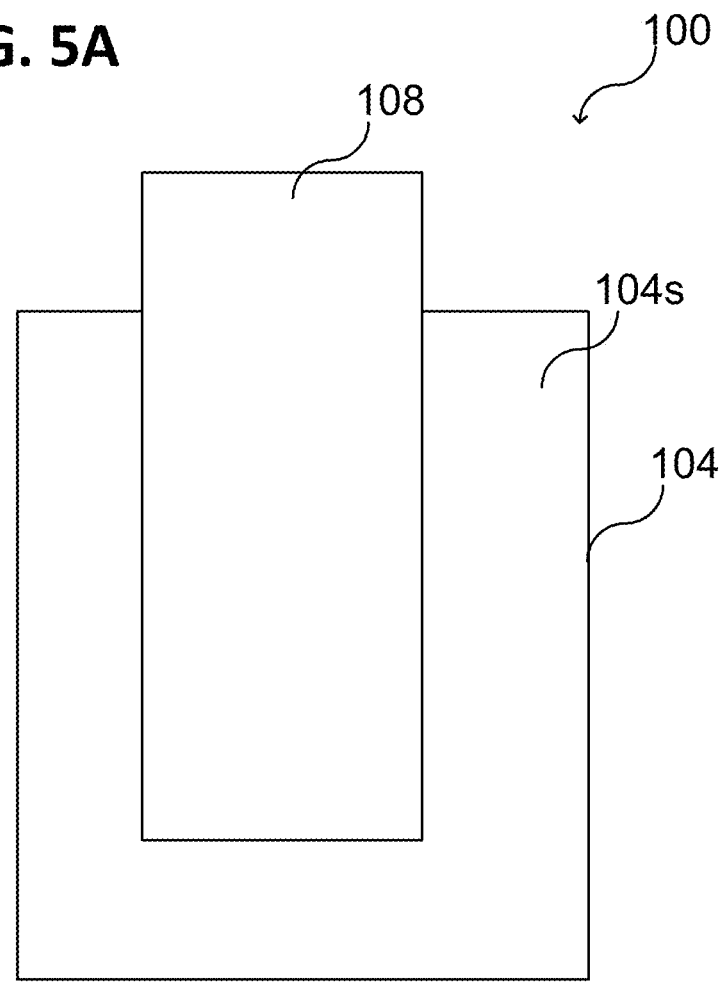
FIG. 5A shows a semiconductor device in a schematic top view according to various embodiments.
Figure 5B:
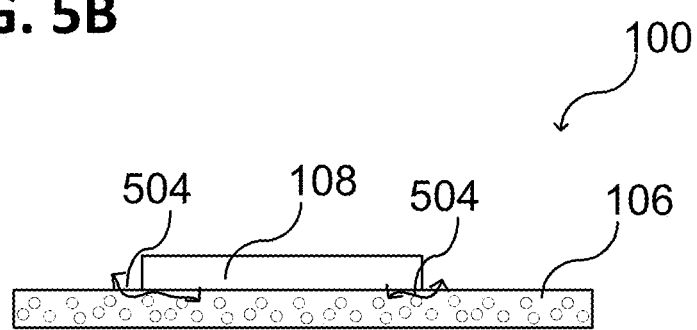
FIG. 5B shows a part of a semiconductor device in a schematic cross sectional view or side view according to various embodiments.

According to various embodiments, as illustrated in FIG. 5A in a schematic top view of the metal clip 108 of the semiconductor device 100 and FIG. 5B in a schematic cross sectional view of the porous metal layer 106 and metal clip 108 of the semiconductor device 100, the porous metal layer 106 may be formed by printing a paste or an ink including micro-particles and nano-particles (e.g. copper micro-particles and copper nano-particles), wherein the paste or the ink is in direct physical contact with the contact pad 104 and the metal clip 108 before the heat treatment is carried out, and, subsequently, drying the paste or the ink and sintering the micro-particles and nano-particles.

Using a metallic foam as connection between the metal clip 108 and the contact pad 104 or the chip metallization 104 may allow to form a mechanically stable connection from pastes or inks including micro-particles and nano-particles by drying and sintering (in other words by annealing or by a heat treatment), wherein during the drying and the sintering a proper outgassing 504 of ink additives and/or paste additives (e.g. solvents, e.g. reaction products) may be provided and/or wherein during the drying and the sintering a proper diffusion 504 of processing gases (e.g. for chemical reduction) may be provided. According to various embodiments, large-scale electrical connections may be limited by the diffusion 504 (e.g. the diffusion of a gaseous reducing agent into the suspension layer provided between the contact pad 104 and the metal clip 108) and outgassing 504 (e.g. the outgassing of solvents and/or reaction products out of the suspension layer provided between the contact pad 104 and the metal clip 108) during the heat treatment for forming the porous metal layer 106 from the layer provided between the contact pad 104 and the metal clip 108. Therefore, a metal clip 108 provided for large-scale electrical connections (e.g. in square millimeter size) may be perforated or patterned to ensure a proper outgassing and diffusion during the heat treatment, as illustrated for example in FIGS. 6A to 7E.

According to various embodiments, a perforation of the metal clip 108 may for example support the expelling of solvent during the heat treatment. Further, the perforation of the metal clip 108 may for example allow the reducing agent to access all regions of the suspension layer to form a homogeneous porous metal layer 106 from the suspension layer. The suspension layer may be an ink or a paste including the metal micro particles and metal nano particles.

Figure 6A:
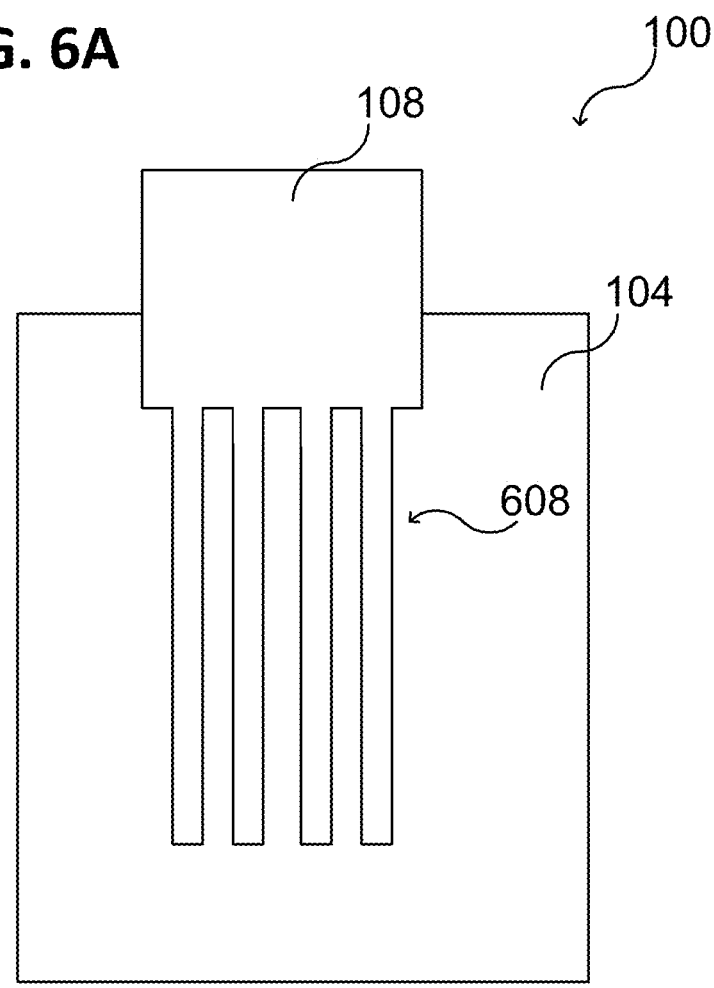
FIG. 6A shows a semiconductor device in a schematic top view according to various embodiments.
Figure 6B:
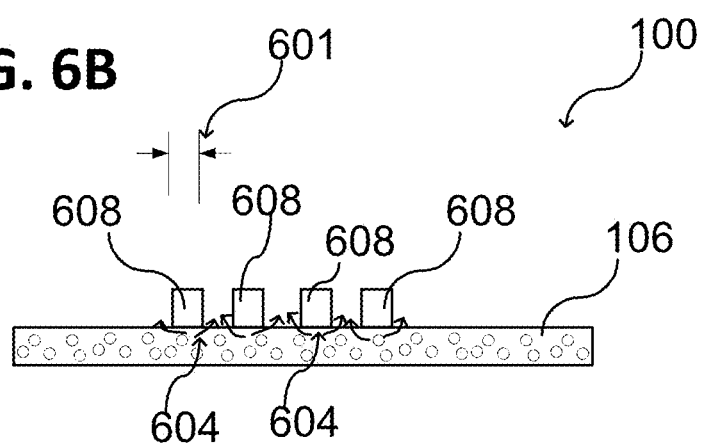
FIG. 6B shows a part of a semiconductor device in a schematic cross sectional view or side view according to various embodiments.

As illustrated in FIG. 6A in a schematic top view onto the metal clip 108 and onto the contact pad 104 of the semiconductor device 100 and in FIG. 6B in a corresponding schematic cross sectional view of the porous metal layer 106 and metal clip 108 of the semiconductor device 100, the metal clip 108 may include one or more recesses, as already described, extending through the metal clip 108 and exposing the suspension layer to be annealed; and exposing the porous metal layer 106 after the heat treatment of the suspension layer is carried out.

Illustratively, the design of the metal clip 108 may allow a gas exchange 604 in the suspension layer during the heat treatment for forming the porous metal layer 106 from the suspension layer by the heat treatment. The porous metal layer 106 may include comb structures, meander structures and/or perforation structures exposing the suspension layer at least partially so that the required diffusion paths 604 for the gas exchange become shorter.

According to various embodiments, the metal clip 108 may include a plurality of metal clip structures 608 (e.g. so called metal fingers) spaced apart from each other. According to various embodiments, the required length of the diffusion paths for the gas exchange 604 may be for example about 30 μm and, therefore, the maximal lateral extension or width 601 of each of the metal clip structures 608 may be about 60 μm. Alternatively, as an example, the required length of the diffusion paths 604 for the gas exchange may be about 100 μm and, therefore, the maximal lateral extension or width 601 of each of the metal clip structures 608 may be about 200 μm. However, the length of the required diffusion paths for the gas exchange 604 may be related to the used gases and for example to the porosity of the porous metal layer 106 to be formed from the paste or ink, and may thus assume different values.

Figure 7A:
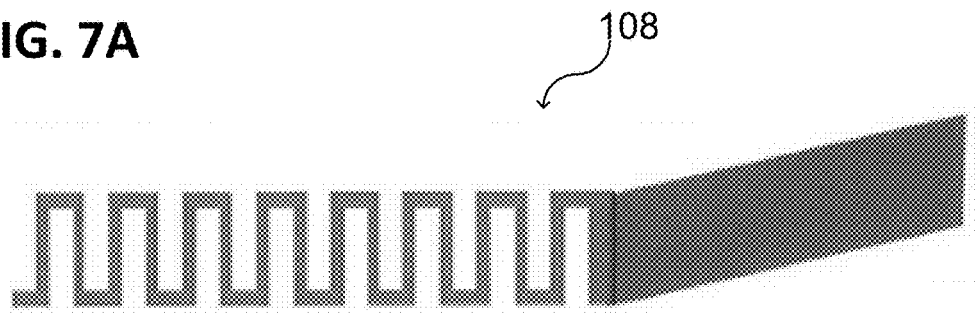
FIGS. 7A to 7E show respectively a design for a metal clip of a semiconductor device in a schematic top view according to various embodiments.
Figure 7B:
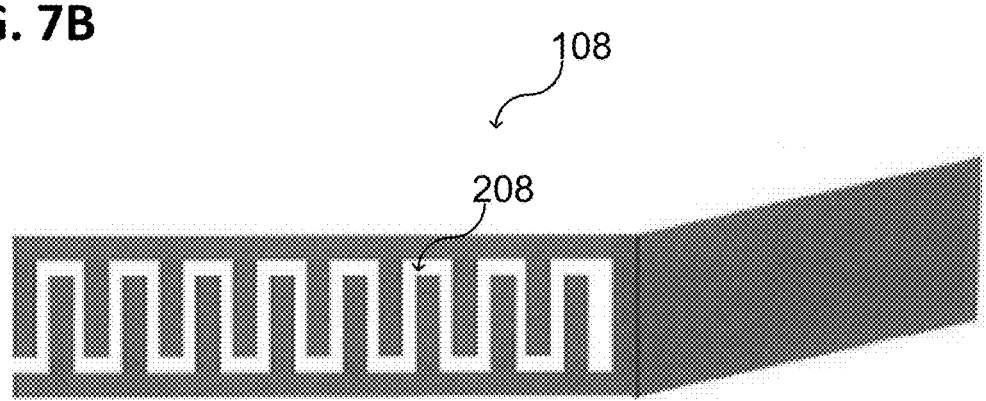
Figure 7C:
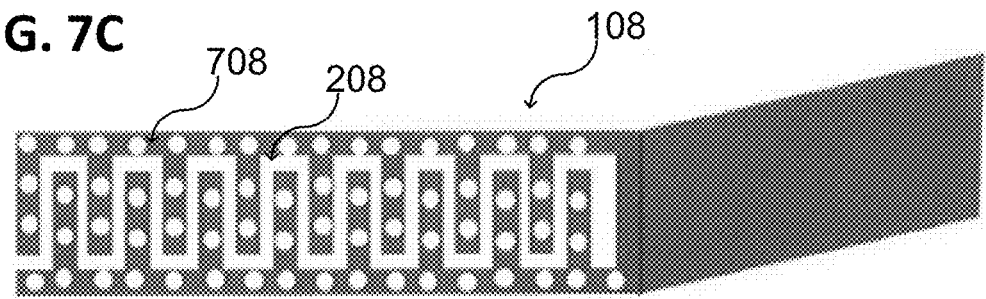
Figure 7D:
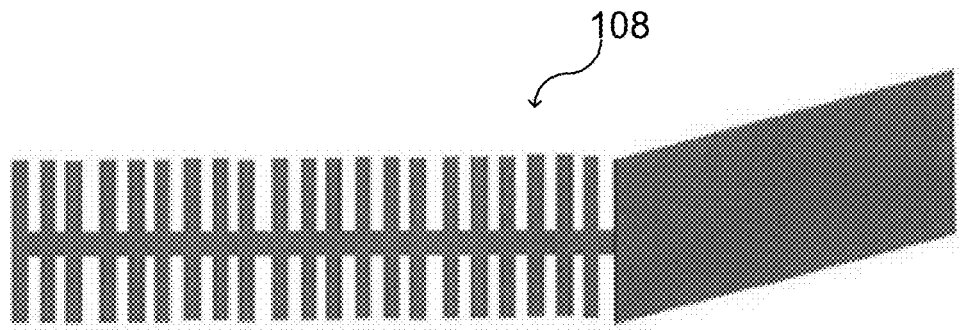
Figure 7E:
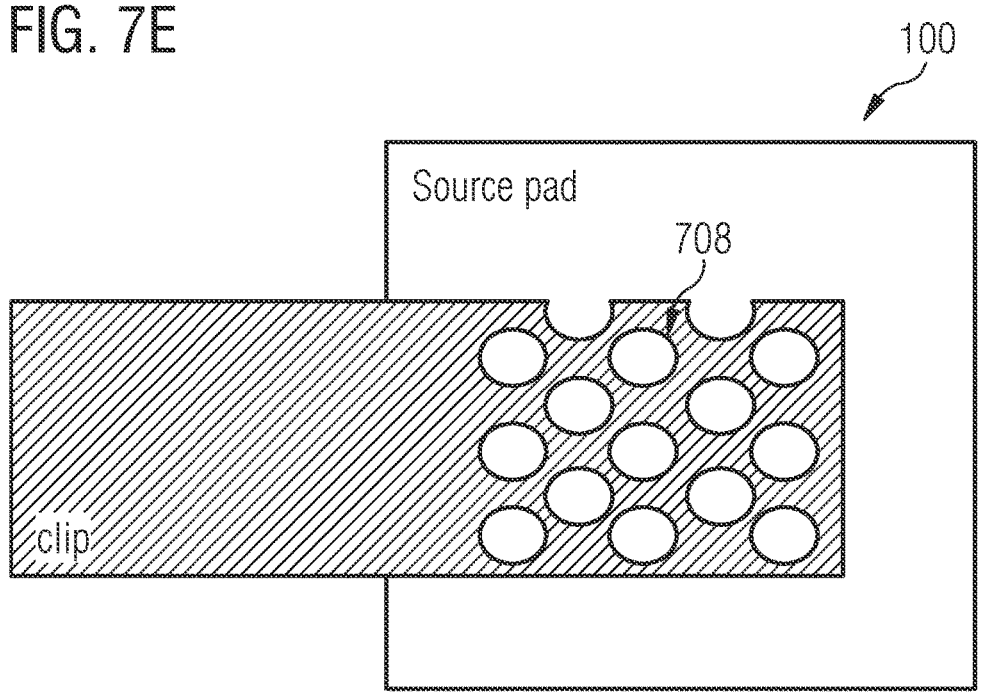

FIG. 7A illustrates a design for a metal clip 108 in a schematic top view according to various embodiments, wherein the metal clip 108 may have a meander structure. FIG. 7B illustrates a design for a metal clip 108 having a recess 208 in a schematic top view according to various embodiments, wherein the recess 208 in the metal clip 108 may have a meander structure. FIG. 7C illustrates a design for a metal clip 108 having a recess 208 in a schematic top view according to various embodiments, wherein the recess 208 in the metal clip 108 may have a meander structure and wherein the metal clip 108 includes further a perforation 708. The perforation 708 may include a plurality of through holes extending through the metal clip 108. FIG. 7D illustrates a design for a metal clip 108 in a schematic top view according to various embodiments, wherein a plurality of recesses 208 may be provided in the metal clip 108 so that the metal clip 108 may have a comb structure. FIG. 7E illustrates a design for a metal clip 108 in a schematic top view according to various embodiments, wherein the metal clip 108 may include a perforation 708. The perforation 708 may include a plurality of through holes extending through the metal clip 108, e.g. vertically through the metal clip 108; or in other words from the first side 108a of the metal clip 108 to the second side 108b of the metal clip 108, as already described for example with reference to FIG. 2.

According to various embodiments, a semiconductor device may include: a contact pad; a metal clip disposed over the contact pad; and a porous metal layer disposed between the metal clip and the contact pad, the porous metal layer connecting the metal clip and the contact pad with each other. According to various embodiments, a semiconductor device may include: a contact pad; a metal clip disposed over the contact pad; and a metallic foam layer disposed between the metal clip and the contact pad, the metallic foam layer connecting the metal clip and the contact pad with each other. The metal clip may include slits and holes provided in the metal clip.

According to various embodiments, the porous metal layer may include or may consist of porous copper. According to various embodiments, the porous metal layer may include open pores and/or closed pores.

According to various embodiments, the metal clip may include or may consist of copper (e.g. bulk copper, e.g. bulk copper coated with a metal). According to various embodiments, the metal clip and/or the contact pad may include or may consist of plated copper, e.g. Ni plated copper, Ni—NiP plated copper, or Ag plated copper. According to various embodiments, the metal clip may be a metal plate.

According to various embodiments, the semiconductor device may include a chip or a die, e.g. a silicon die, wherein the contact pad may electrically contact the chip or the die. According to various embodiments, the semiconductor device may include an integrated circuit structure, wherein the contact pad may electrically contact the integrated circuit structure. According to various embodiments, the semiconductor device may include a housing or a package at least partially surrounding the chip, the die, or the integrated circuit structure of the semiconductor device.

According to various embodiments, a semiconductor package may include: an integrated circuit structure (e.g. a chip or a die), the integrated circuit structure including at least one terminal (e.g. at least one contact pad); a metal clip disposed over the at least one terminal; and a porous metal layer (e.g. a metallic foam layer) disposed between the metal clip and the at least one terminal, the porous metal layer (or the metallic foam layer) connecting the metal clip and the at least one terminal with each other. The metal clip may electrically connect two or more than two chips of a multi-chip package with each other.

According to various embodiments, the metal clip may be a package interconnection connecting the chip, the die or the integrated circuit structure of the semiconductor device to a chip package of the semiconductor device. According to various embodiments, the semiconductor device may be a semiconductor package.

According to various embodiments, the contact pad may include or may consist of copper.

According to various embodiments, the metal clip may be perforated. According to various embodiments, the metal clip may include a plurality of holes extending through the metal clip. According to various embodiments, the metal clip may include a plurality of slits or recesses extending through the metal clip. According to various embodiments, the metal clip may be perforated with a spatially periodically arranged holes and/or slits.

According to various embodiments, the metal clip may include a recess structure extending from a first side of the metal clip facing the porous metal layer (or the metallic foam layer) to a second side of the metal clip opposite to the first side. Further, the recess structure may be configured so that the metal clip has a meander structure or a comb structure.

According to various embodiments, an electronic device may include: a contact pad; a metal structure disposed over the contact pad; and a porous copper layer disposed between the contact pad and the metal structure, the porous copper layer connecting the contact pad and the metal structure with each other. According to various embodiments, an electronic device may include: an electronic circuit, the electronic circuit including at least one contact pad; a metal structure disposed over the at least one contact pad; and a porous copper layer disposed between the at least one contact pad and the metal structure, the porous copper layer connecting the at least one contact pad and the metal structure with each other.

According to various embodiments, the metal structure may include or may be a lead frame or a printed circuit board. Further, the electronic device may be or may include a semiconductor device. According to various embodiments, the contact pad may be a back side contact pad at a back side of a chip or die of the semiconductor device. Further, the contact pad may be a part of a back side metallization to connect the chip or the die of the semiconductor device to a lead frame. Further, the contact pad may be a part of a back side metallization to connect the chip or the die of the semiconductor device to a further chip or die of the semiconductor device, e.g. in case the semiconductor device includes a plurality of chips or dies.

According to various embodiments, the porous copper layer may include or may consist of copper with a porosity greater than about 10%. According to various embodiments, the porous copper layer may include or may consist of copper with a porosity greater than about 20%. According to various embodiments, the porous copper layer may include or may consist of copper with a porosity greater than about 30%. According to various embodiments, the porous copper layer may include or may consist of copper with a porosity greater than about 40%. According to various embodiments, the porous copper layer may include or may consist of copper with a porosity greater than about 50%. According to various embodiments, the porous copper layer may include or may consist of copper with a porosity greater than about 60%.

According to various embodiments, the porous copper layer may have a thickness greater than about 5 µm. According to various embodiments, the porous copper layer may have a thickness greater than about 10 µm. According to various embodiments, the porous copper layer may have a thickness greater than about 20 µm. According to various embodiments, the porous copper layer may have a thickness greater than about 30 µm.

According to various embodiments, the metal structure may include or may be a metal clip. According to various embodiments, the metal structure may include or may be a bond wire.

According to various embodiments, the contact pad may include a first material which can form an alloy with copper during the heat treatment. According to various embodiments, the contact pad may include or may consist of copper.

According to various embodiments, the metal structure may include a second material which can form an alloy with copper during the heat treatment. According to various embodiments, the metal structure may include or may consist of copper.

According to various embodiments, the contact pad and/or the metal clip may include at least one of the following materials: copper; nickel; phosphor; tin; silver; gold.

According to various embodiments, a method may include: forming a suspension layer over a surface of a first metal structure, the suspension layer including metal micro-particles and metal nano-particles suspended in an organic solvent; disposing a second metal structure over the suspension layer, wherein the second metal structure may be in (direct) physical contact with the suspension layer; and, subsequently, forming a porous metal layer from the suspension layer by a heat treatment, the porous metal layer connecting the first metal structure and the second metal structure with each other.

According to various embodiments, a method (e.g. for connecting a first metal structure and a second metal structure with each other) may include: forming a suspension layer over a surface of a first metal structure, the suspension layer including metal micro-particles and metal nano-particles suspended in a liquid or viscous solvent (e.g. an organic liquid or an organic solvent); disposing a second metal structure over the suspension layer, wherein the second metal structure may be in (direct) physical contact with the suspension layer; and, subsequently, forming a porous metal layer from the suspension layer by a heat treatment, the porous metal layer connecting the first metal structure and the second metal structure with each other.

According to various embodiments, the heat treatment may be carried out in the presence of a reducing gas or a reducing agent, e.g. formic acid. A reducing gas or reducing agent may prevent the oxidation of the metal particles during the heat treatment. According to various embodiments, the heat treatment may be carried out in the presence of formic acid and at least one inert gas (e.g. nitrogen and/or argon).

According to various embodiments, the organic solvent may be at least partially expelled from the suspension layer by the heat treatment and at least one of the metal micro-particles and the metal nano-particles may agglomerate with each other during the heat treatment.

According to various embodiments, the metal micro-particles may include or may be copper micro-particles. According to various embodiments, the metal micro-particles may include or may be nickel micro-particles. According to various embodiments, the metal micro-particles may include or may be silver (e.g. denoted with atomic symbol Ag) micro-particles. According to various embodiments, the metal micro-particles may include or may be gold micro-particles.

According to various embodiments, the metal nano-particles may include or may be copper nano-particles. According to various embodiments, the metal nano-particles may include or may be nickel nano-particles. According to various embodiments, the metal nano-particles may include or may be silver nano-particles. According to various embodiments, the metal nano-particles may include or may be gold nano-particles.

According to various embodiments, the heat treatment may be performed at a temperature less than the bulk melting temperature of the metal of the metal nano-particles and/or the metal micro-particles.

According to various embodiments, the heat treatment may be performed at a temperature less than the bulk melting temperature of copper, e.g. in case the metal nano-particles and/or the metal micro-particles may include or may consist of copper.

According to various embodiments, a method may include: forming a layer over a surface of a first metal structure, the layer comprising metal micro-particles and metal nano-particles; disposing a second metal structure over the layer, wherein the second metal structure is in physical contact with the layer; and forming a porous metal layer from the layer by a heat treatment, the porous metal layer connecting the first metal structure and the second metal structure with each other.

Further, the layer may include metal micro-particles and metal nano-particles suspended in an organic solvent. The organic solvent may be at least partially expelled by the heat treatment. Alternatively, the layer may include a precursor which forms the metal micro-particles and the metal nano-particles during the heat treatment. The precursor may include a metal containing compound which provides metal micro-particles and metal nano-particles during the heat treatment. The metal micro-particles and metal nano-particles may be formed from the precursor by temperature thermolysis. The layer may include a metal containing precursor and the metal micro-particles and the metal nano-particles may be formed from the metal containing precursor, e.g. during the heat treatment or by a pre-annealing.

According to various embodiments, the precursor for forming metal particles or a metal layer may include a metal complex. According to various embodiments, the precursor for forming copper particles or a copper layer may be copper formate, e.g. $(HCO_2)_2Cu \times H_2O$.

According to various embodiments, a method may include: forming a layer over a first metal structure, the layer comprising a precursor for forming metal micro-particles and metal nano-particles (e.g. during a heat treatment); disposing a second metal structure over the layer, wherein the second metal structure is in physical contact with the layer; and forming the metal micro-particles and the metal nano-particles from the layer and a porous metal layer from the metal micro-particles and the metal nano-particles by a heat treatment, the porous metal layer connecting the first metal structure and the second metal structure with each other.

According to various embodiments, a method may include: forming a layer over a first metal structure, the layer comprising a precursor for forming metal micro-particles and metal nano-particles during a heat treatment; disposing a second metal structure over the layer, wherein the second metal structure is in physical contact with the layer; and heating (or annealing) the layer so as to form a porous metal layer from the layer, the porous metal layer connecting the first metal structure and the second metal structure with each other.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor device comprising:
   a contact pad;
   a metal clip disposed over the contact pad; and
   a porous metal layer disposed directly between the metal clip and the contact pad, the porous metal layer mechanically connecting the metal clip and the contact pad with each other,
   wherein the metal clip comprises openings extending from a first side of the metal clip facing the porous metal layer to a second side of the metal clip opposite to the first side, the openings defining a meander structure of the metal clip that is disposed directly on the porous metal layer.

2. The semiconductor device according to claim 1; wherein the porous metal layer comprises porous copper.

3. The semiconductor device according to claim 1; wherein the contact pad comprises at least one of the following materials: copper; nickel; nickel/phosphor; tin; silver; gold.

4. The semiconductor device according to claim 1; wherein the metal clip comprises at least one of the following materials: copper; nickel; nickel/phosphor; tin; silver; gold.

5. The semiconductor device according to claim 1; wherein the metal clip is perforated.

6. The semiconductor device of claim 1, wherein the meandering structure of the metal clip has a serpentine-like shape.

7. The semiconductor device of claim 1, wherein the meandering structure of the metal clip has a pulse wave like shape.

8. An electronic device comprising:
a contact pad;
a metal structure disposed over the contact pad; and
a porous copper layer disposed directly between the contact pad and the metal structure, the porous copper layer mechanically connecting the contact pad and the metal structure with each other.

9. The electronic device according to claim 8; wherein the porous copper layer comprises copper with a porosity greater than 10%.

10. The electronic device according to claim 8; wherein the porous copper layer has a thickness greater than 5 µm.

11. The electronic device according to claim 8; wherein the metal structure comprises a metal clip.

12. The electronic device according to claim 8; wherein the contact pad comprises a first material which can form an alloy with copper.

13. The electronic device according to claim 8; wherein the metal structure comprises a second material which can form an alloy with copper.

14. The electronic device of claim 8, wherein the porous copper layer disposed directly between the contact pad and the metal structure is formed by a heat treatment of a layer comprising metal micro-particles and metal nano-particles, the heat treatment performed at a temperature less than the bulk melting temperature of the metal.

15. A semiconductor device comprising:
a semiconductor carrier comprising a contact pad provided at a first side of the semiconductor carrier;
a metal clip comprising a portion disposed over the contact pad and over the first side of the semiconductor carrier, wherein the portion comprises an opening having a meander structure, the portion extending parallel to the first side of the semiconductor carrier; and
a porous metal layer disposed directly between the metal clip and the contact pad, the porous metal layer mechanically connecting the metal clip and the contact pad with each other.

16. The semiconductor device of claim 15, wherein the porous metal layer is a porous copper layer.

17. The semiconductor device of claim 15, wherein the portion of the metal clip is perforated.

* * * * *